United States Patent [19]

Kornowski et al.

[11] Patent Number: 5,742,007

[45] Date of Patent: Apr. 21, 1998

[54] ELECTRONIC DEVICE PACKAGE AND METHOD FOR FORMING THE SAME

[75] Inventors: Robert R. Kornowski, Schaumburg; Carl Missele, Elgin, both of Ill.; Thomas W. Rice, Phoenix, Ariz.

[73] Assignee: Motorola, Inc., Schaumburg, Ill.

[21] Appl. No.: 695,813

[22] Filed: Aug. 5, 1996

[51] Int. Cl.$^6$ ..................... H05K 5/06
[52] U.S. Cl. ............ 174/52.3; 174/52.4; 257/704; 361/688
[58] Field of Search .................. 257/682, 700, 257/703, 729, 793; 174/52.3, 52.4; 361/718, 730, 820, 688, 690, 692, 693

[56] References Cited

U.S. PATENT DOCUMENTS

| | | | |
|---|---|---|---|
| 4,809,135 | 2/1989 | Yerman | 361/404 |
| 5,110,784 | 5/1992 | Williams et al. | 502/401 |
| 5,248,848 | 9/1993 | Kornowski et al. | |
| 5,532,513 | 7/1996 | Smith et al. | 257/703 |

*Primary Examiner*—Kristine L. Kincaid
*Assistant Examiner*—Hung V. Ngo
*Attorney, Agent, or Firm*—Ziye Zhou; Rennie William Dover

[57] ABSTRACT

An electronic device package (10) is resistant to rupture at high temperatures. The electronic device package (10) includes a cap (14) having side-walls (18) coupled to a support structure (11) via an adhesive (15). The cap (14) is permeable to gases including water vapor. The side-walls (18) of the cap (14) are made of a porous ceramic material which absorbs a portion of the adhesive (15) via capillary action while curing the adhesive (15).

14 Claims, 1 Drawing Sheet

5,742,007

ELECTRONIC DEVICE PACKAGE AND METHOD FOR FORMING THE SAME

BACKGROUND OF THE INVENTION

The present invention relates, in general, to electronic devices and, more particularly, to electronic device packages.

In many applications, an electronic devices such as a power transistor, needs to be enclosed in a package for support, protection, and ease of use during subsequent manufacturing. A power transistor package includes a support surface, on which the power transistor is mounted, and a housing coupled to the support surface, thereby enclosing the power transistor. The housing is coupled to the support surface via an appropriate adhesive, such as epoxy. Typically, the adhesive is cured by heating.

During the adhesive curing process or later during a reflow soldering process, the atmospheric content within the enclosure expands. As a result of this expansion, the atmospheric content can overcome the resistance of the adhesive material and produce a rupture in the adhesive material. This rupture provides a pathway for larger molecules, such as molten solder or flux, into the package, which can damage the transistor located in the package. A rupture formed in the adhesive curing process can be mended or repaired. However, mending the rupture is a costly and time consuming process. In addition, the mended area is prone to rupture again when the temperature is elevated during the reflow soldering process.

Furthermore, the epoxy adhesive becomes more fluid or less viscous and sometimes flows on the support surface when the temperature is elevated during the adhesive curing process. The less viscous epoxy may damage the transistor located within the package or contaminate the electrical contact structures that are typically located on the support surface outside the housing. The contaminated electrical contact structures may be partially or totally covered with the nonconductive epoxy which prevents formation of electrical connections to other circuit components.

Accordingly, it would be advantageous to have an electronic device package and a method for forming the package. It is desirable that the package not rupture during high temperature processes such as adhesive curing and reflow soldering. It is also desirable to be able to control the flow of the adhesive material on the support structure.

DETAILED DESCRIPTION OF THE DRAWINGS

Generally, the present invention provides an electronic device package and a method for forming the package. The package includes a support structure for supporting the electronic device and a cap or a housing coupled to the support structure and enclosing the electronic device. The cap includes side-walls and a top. A unique feature of the present invention is that the side-walls of the cap are porous and coupled to the support structure via a bonding agent such as, for example, an epoxy adhesive. The bonding agent is substantially resistant to the passage of gases and liquids therethrough. The porous side-walls of the cap are less resistant to the passage of gases, but are still substantially resistant to the passage of molecules having a high cohesive force, such as the molecules of liquid solder. As a result, water vapor and other atmospheric content of the package can safely vent through the side-walls of the cap when the temperature is elevated, thereby maintaining or preserving the physical integrity of the bonding agent during elevated temperature processes such as adhesive curing or reflow soldering. Furthermore, the porous side-walls of the cap promote directed absorption of the bonding agent into the lower portion of the side-walls by the process of capillary action. This minimizes the flow of the bonding agent on the support structure and provides a greater tolerance for volumetric variation of the bonding agent.

Figure 1:
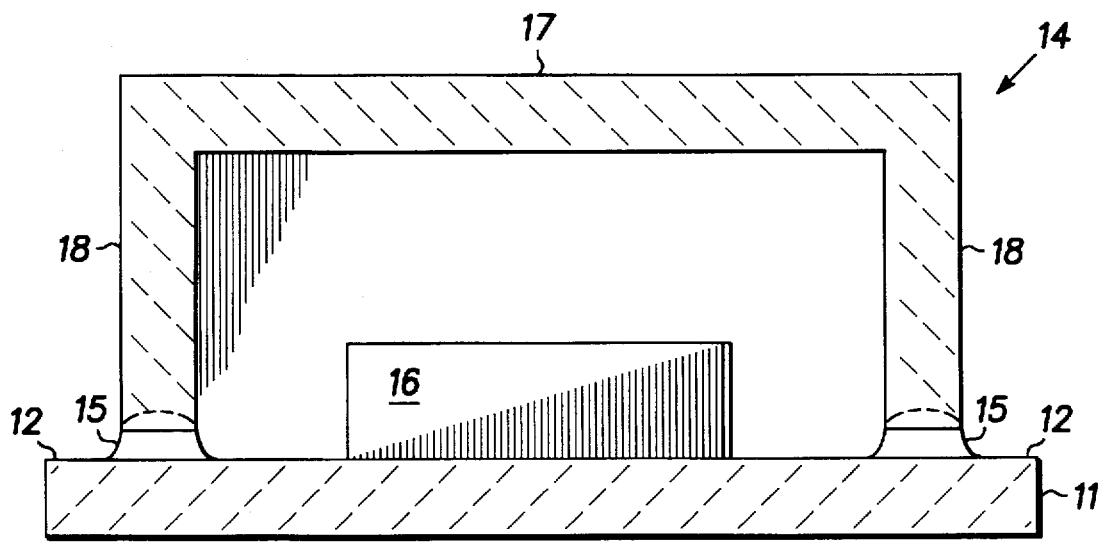
FIG. 1 cross-sectional view of an electronic device package in accordance with the present invention.

FIG. 1 is a cross-sectional view of an electronic device package 10 in accordance with the present invention. Electronic device package 10 includes a support structure 11 having a major surface 12, a housing or a cap 14, and a bonding agent 15. These components are configured to enclose an electronic device 16 such as, for example, a power transistor. Electronic device 16 is mounted on major surface 12 using techniques well known to those skilled in the art. Further, electronic device 16 is electrically connected to soldering pads (not shown in FIG. 1) on major surface 12.

Support structure 11 is preferably made of a non-porous material such as, for example, a non-porous ceramic material. Cap 14 includes a top 17 and side-walls 18. In a preferred embodiment, top 17 and side-walls 18 are integrally made of a porous ceramic material which is substantially permeable to gases including water vapor and substantially impermeable to liquid solder. An adhesive material such as, for example, an epoxy, serves as bonding agent 15 and is applied to the edges of side-walls 18. Cap 14 is placed on support structure 11 to enclose electronic device 16. The edges of side-walls 18 are attached to major surface 12 of support structure 11 via bonding agent 15.

Bonding agent 15 is cured by heating. During the curing process, the atmospheric content enclosed in support structure 11 and cap 14 expands as the temperature rises. Because of the gas permeability of cap 14, small molecules, such as gas molecules including water vapors propagate through top 17 and the upper portion of side-walls 18 substantially unimpeded in response to various atmospheric conditions in cap 14, such as heat induced pressure and the conversion of water into vapor or steam. Thus, the difference between the pressures inside and outside cap 14 remains sufficiently small during the curing process, thereby preventing bonding agent 15 from being ruptured or damaged. Further, when the temperature rises during the curing process, epoxy bonding agent 15 becomes more fluid and less viscous. In other words, epoxy bonding agent 15 is in a state characterized by its low viscosity. The lower portion of porous sidewalls 18 of cap 14 absorbs a portion of the epoxy via capillary action, thereby minimizing an undesirable flow of the epoxy onto major surface 12 of support structure 11.

After the curing process, epoxy bonding agent 15 is in a state characterized by its solidity. In the solid state, epoxy agent 15 bonds cap 14 to support structure 11, thereby forming electronic device package 10. When cured, epoxy bonding agent 15 is substantially resistant to the passage of gases and liquids. Package 10 protects electronic device 16 from physically hazardous conditions that may be present in the environment and could degrade the performance of electronic device 16. During a reflow soldering process, the pressure inside package 10 remains substantially in balance with the ambient pressure because of the gas permeability of cap 14. Therefore, the physical integrity of bonding agent 15 is maintained. Bonding agent 15 impedes molten solder or flux from passing therethrough.

It should be understood that support structure 11 is not limited to being made of a ceramic material. In accordance with the present invention, support structure 11 is preferably made of a material which is resistant to the passage of liquids. For example, support structure 11 may be made of a beryllium pill to which to a metallic flange is attached, a beryllium pill having a copper metallized solder pad, or the like. It should also be understood that the gas permeability of top 17 of cap 14 is optional. In other words, top 17 may be made of a non-porous material. It should be further understood that cap 14 is not limited to being made of ceramic material. In accordance with the present invention, sidewalls 18 of cap 14 are preferably made of a material which allows the passage of gases including water vapor but is substantially resistant to the passage of liquid solder. Further, side-walls 18 of cap 14 are preferably sufficiently porous to be absorbent to bonding agent 15 by the process of capillary action during the adhesive curing process. For example, side-walls 18 of cap 14 may be made of a porous high temperature plastic material. Alternatively, top 17 and sidewalls 18 of cap 14 are integrally made of the porous high temperature plastic material to simplify the manufacturing process.

Figure 2:
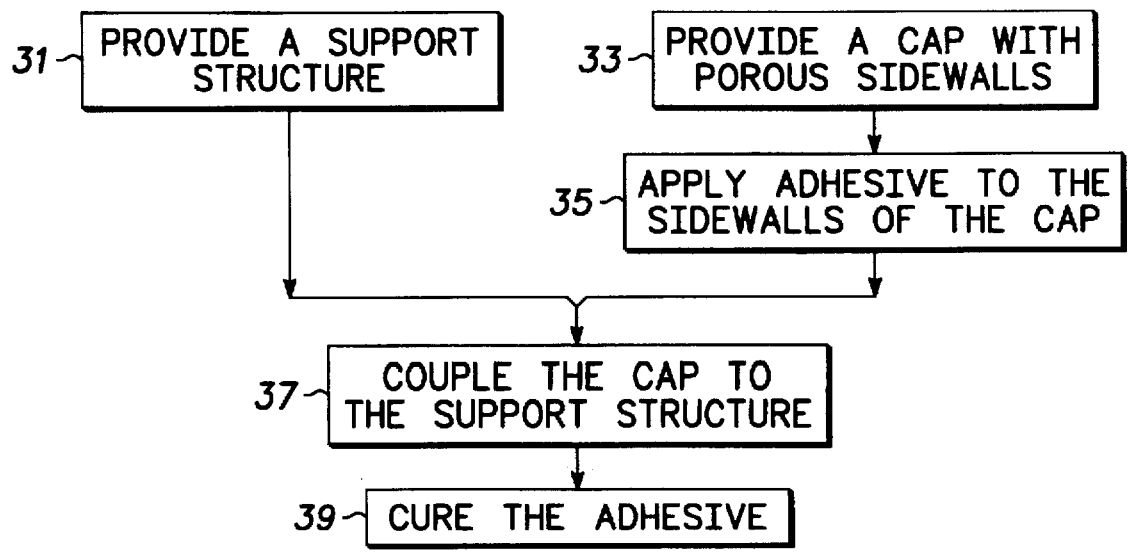
FIG. 2 is a flow chart of a method for forming an electronic device package in accordance with the present invention.

FIG. 2 is a flow chart 30 of a method for forming an electronic device package in accordance with the present invention. The electronic device package is formed to enclose an electronic device such as, for example, a power transistor, and to protect the electronic device during a reflow soldering process and subsequent use of the electronic device.

In a first step (reference number 31) of forming the electronic device package, a support structure having an electronic device disposed or mounted thereon is provided. The electronic device is mounted on a major surface of the support structure. In a preferred embodiment, the support structure is comprised of a non-porous ceramic structure that is resistant to the passage of gases and liquids. The electrodes of the electronic device are electrically connected to corresponding electrical contacts such as, for example, soldering pads, on the support structure. The techniques of mounting and electrically connecting an electronic device to a support structure are well known to those skilled in the art.

A housing or a cap which includes a top and side-walls is provided (reference number 33). The cap is substantially impermeable to liquid solder. The side-walls of the cap are substantially permeable to gases including water vapor. The top of the cap may be either permeable or impermeable to gases. In a preferred embodiment, the top and the side-walls of the cap are integrally made of a gas permeable porous material, such as a porous ceramic material or a porous plastic material. Thus, the cap includes a porous top as well as porous side-walls.

In a next step (reference number 35), an adhesive such as, for example, an epoxy, is applied to the edges of the sidewalls of the cap. The cap is coupled to the support structure (reference number 37) so that the adhesive applied to the edges of the side-walls of the cap contacts the major surface of the support structure and the electronic device is enclosed by the cap and the support structure. It should be noted that the adhesive is not limited to being applied to the side-walls of the cap. In accordance with the present invention, the adhesive is disposed between the cap and the support structure. In an alternative embodiment, the adhesive is applied to the major surface of the support structure in a pattern that matches the side-walls of the cap.

The adhesive is cured by heating (reference number 39). During the curing process, the adhesive becomes less viscous as the temperature rises. Thus, epoxy bonding agent 15 is in a low viscosity state or a liquid state. The porous side-walls of the cap absorb a portion of the adhesive via capillary action while the adhesive is in the low viscosity state, thereby limiting or minimizing the flow of the adhesive onto the major surface of the support structure. Further, the gas permeability of the cap allows small molecules, such as gas molecules including those of water vapor, to pass substantially unimpeded. Therefore, the pressure inside the package remains substantially in balance with the pressure outside the package during the curing process and the rupturing of the adhesive is prevented.

After the curing process, the adhesive solidifies and bonds the cap to the support structure, thereby forming the electronic device package. When cured, the adhesive in the solid state impedes gases and liquids from passing therethrough. The package protects the electronic device enclosed therein from hazardous physical conditions that may be present in the environment and degrade the performance of the electronic device. It should be noted that the gas permeability of the cap also prevents the cured adhesive material from being ruptured during a subsequent reflow soldering process or any other process in which the temperature is elevated.

By now it should be appreciated that an electronic device package and a method for forming the electronic device package have been provided. The electronic device package of the present invention is permeable to gases so that the atmospheric content within the package including water vapor can vent through the package substantially unimpeded. Therefore, the rupture of the package is prevented during high temperature processes such as adhesive curing process and reflow soldering. Accordingly the electronic device package is reflow soldering process compatible. Further, in accordance with the present invention, the side-walls of the cap are sufficiently porous to absorb a portion of the less viscous adhesive during the adhesive curing process, thereby limiting the undesirable flow of the adhesive on the support structure.

While specific embodiments of the present invention have been shown and described, further modifications and improvements will occur to those skilled in the art. It is understood that the present invention is not limited to the particular forms shown and it is intended for the appended claims to cover all modifications of the invention which fall within the true spirit and scope of the invention. For example, the support structure of the package may be made of a porous material that selectively allows gases to pass therethrough unimpeded while blocking the flow of liquids. Furthermore, the package may also be used to enclose a plurality of devices, an integrated circuit chip, or the like.

We claim:

1. A gas permeable package, comprising:
    a support structure having a major surface;
    a cap over the major surface of the support structure, the cap including a top and a porous side-wall, wherein the porous side-wall is substantially permeable to a gas; and
    a bonding agent being in one of a first state characterized by a low viscosity of the bonding agent or a second state characterized by a solidity of the bonding agent, the bonding agent coupling the porous side-wall of the cap to the major surface of the support structure, wherein the bonding agent in the first state is absorbable by the porous side-wall of the cap.

2. The gas permeable package of claim 1, wherein the support structure includes a non-porous ceramic structure.

3. The gas permeable package of claim 1, wherein the top of the cap is substantially impermeable to the gas.

4. The gas permeable package of claim 1, wherein the porous side-wall of the cap is substantially impermeable to a liquid solder.

5. The gas permeable package of claim 1, wherein the top and the porous side-wall of the cap are integrally made of a porous material.

6. The gas permeable package of claim 5, wherein the top and the porous side-wall of the cap are integrally made of a porous ceramic material.

7. The gas permeable package of claim 5, wherein the top and the porous side-wall of the cap are integrally made of a porous plastic material.

8. The gas permeable package of claim 1, wherein the bonding agent is substantially impermeable to the gas and substantially impermeable to a liquid.

9. The gas permeable package of claim 8, wherein the bonding agent is an epoxy adhesive.

10. An electronic device package for packaging an electronic device, comprising:

a support structure having a major surface on which the electronic device is disposed;

a housing over the major surface of the support structure, the housing and the support structure enclosing the electronic device, wherein the housing allows a gas to pass substantially unimpeded therethrough and substantially impedes a liquid solder from passing therethrough; and a bonding agent which couples the housing to the support structure, the bonding agent being in one of a low viscosity state and a solid state, wherein the housing is absorbent to the bonding agent when the bonding agent is in the low viscosity state.

11. The electronic device package of claim 10, wherein the housing is made of a porous ceramic material.

12. The electronic device package of claim 10, wherein the housing is made of a porous plastic material.

13. The electronic device package of claim 10, wherein the bonding agent substantially impedes the gas from passing therethrough.

14. The electronic device package of claim 13, wherein the bonding agent includes an epoxy adhesive.

* * * * *